United States Patent [19]

Hung et al.

[11] Patent Number: 6,137,223
[45] Date of Patent: Oct. 24, 2000

[54] ELECTRON-INJECTING LAYER FORMED FROM A DOPANT LAYER FOR ORGANIC LIGHT-EMITTING STRUCTURE

[75] Inventors: Liang S. Hung, Webster; Joseph K. Madathil, Rochester, both of N.Y.

[73] Assignee: Eastman Kodak Company, Rochester, N.Y.

[21] Appl. No.: 09/123,602

[22] Filed: Jul. 28, 1998

[51] Int. Cl.[7] ................................................. H01J 1/62
[52] U.S. Cl. ..................... 313/506; 313/504; 313/503; 428/690; 428/917
[58] Field of Search .................................. 313/503, 504, 313/506; 428/917, 690; 427/66

[56] References Cited

U.S. PATENT DOCUMENTS

| | | |
|---|---|---|
| 3,530,325 | 9/1970 | Mehl et al. . |
| 3,621,321 | 11/1971 | Williams et al. . |
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 5,047,607 | 9/1991 | Briffod . |
| 5,429,884 | 7/1995 | Namiki et al. ........................... 428/690 |
| 5,989,737 | 11/1999 | Xie et al. ................................. 428/690 |
| 6,013,384 | 1/2000 | Kido et al. .............................. 428/690 |
| 6,023,073 | 2/2000 | Strite ........................................ 257/40 |

Primary Examiner—Vip Patel
Assistant Examiner—Karabi Guharay
Attorney, Agent, or Firm—Raymond L. Owens

[57] ABSTRACT

An organic light-emitting device including a substrate; an anode disposed over the substrate; an organic light-emitting structure disposed over the anode; a cathode buffer layer disposed over the organic light-emitting structure and formed of a material selected to permit high energy deposition of a cathode; a cathode disposed over the cathode buffer layer; and a dopant layer disposed between the cathode buffer layer and the cathode and being provided with an electron-injecting dopant which diffuses across the buffer layer to provide an interfacial electron-injecting layer at the interface between the light-emitting structure and the cathode buffer layer.

22 Claims, 9 Drawing Sheets

ELECTRON-INJECTING LAYER FORMED FROM A DOPANT LAYER FOR ORGANIC LIGHT-EMITTING STRUCTURE

CROSS REFERENCE TO RELATED APPLICATIONS

Reference is made to related to U.S. application Ser. No. 09/124,150 filed Jul. 28, 1998 entitled "Interfacial Electron-Injecting Layer Formed From a Doped Cathode for Organic Light-Emitting Structure" to Liang-Sun Hung, Joseph K. Madathil and Ching Wan Tang, and U.S. application Ser. No. 09/123,601 filed Jul. 28, 1998 entitled "Electron-Injecting Layer Providing a Modified Interface Between an Organic Light-Emitting Structure and a Cathode Buffer Layer" to Liang-Sun Hung, Ching Wan Tang, and Pranab K. Raychaudhuri

FIELD OF THE INVENTION

This invention relates to organic light-emitting devices. More particularly, this invention relates to devices which have an organic cathode buffer layer disposed over an organic light-emitting structure, and an electron-injecting dopant diffused from a dopant layer across the cathode buffer layer.

BACKGROUND OF THE INVENTION

Organic light-emitting devices, also referred to as organic electroluminescent (EL) devices or as organic internal junction light-emitting devices, contain spaced electrodes separated by an organic light-emitting structure (also referred to as an organic EL medium) which emits electromagnetic radiation, typically light, in response to the application of an electrical potential difference across the electrodes. The organic light-emitting structure must not only be capable of producing light efficiently, but must be capable of fabrication in a continuous form (i.e., must be free of pinholes and particle defects) and must be sufficiently stable to facilitate fabrication and to support operation.

Initially organic EL devices were fabricated using single crystals of organic materials, as illustrated by Mehl et al U.S. Pat. No. 3,530,325, and Williams U.S. Pat. No. 3,621,321. Single organic crystal EL devices were relatively difficult to fabricate and further did not readily lend themselves to thin film constructions.

In recent years, preferred organic EL devices have been constructed employing thin film deposition techniques. Using an anode as a device support, the organic electroluminescent medium has been deposited as one or a combination of thin films followed by the deposition of a cathode, also formed as a thin film deposition. Thus, starting with the anode structure, it is possible to form the entire active structure of an organic EL device by thin film deposition techniques. As employed herein, the term "thin film" refers to layer thicknesses of less than 5 $\mu$m, with layer thicknesses of less than about 2 $\mu$m being typical. Examples of organic EL devices containing organic electroluminescent medium and cathode constructions formed by thin film deposition techniques are provided by Tang U.S. Pat. No. 4,356,429, VanSlyke et al U.S. Pat. Nos. 4,539,507 and 4,720,432, and Tang et al U.S. Pat. No. 4,769,292.

While the art has encountered little difficulty in constructing fully acceptable stable anodes for internal junction organic EL devices, cathode construction has been a matter of extended investigation. In selecting a cathode metal, a balance must be struck between metals having the highest electron-injecting efficiencies and those having the highest levels of stability. The highest electron-injecting efficiencies are obtained with alkali metals, which are too unstable for convenient use, while metals having the highest stabilities show limited electron injection efficiencies and are, in fact, better suited for anode construction.

Tang U.S. Pat. No. 4,356,429 teaches to form cathodes of organic EL devices of metals such as indium, silver, tin, and aluminum. VanSlyke et al U.S. Pat. No. 4,539,507 teaches to form the cathodes of organic EL devices of metals such as silver, tin, lead, magnesium, maganese, and aluminum. Tang et al U.S. Pat. No. 4,885,211 teaches to form the cathodes of organic EL devices of a combination of metals, with at least 50 percent (atomic basis) of the cathode being accounted for by a metal having a work function of less than 4.0 eV. VanSlyke U.S. Pat. No. 5,047,607 teaches the use of a cathode containing a plurality of metals, at least one of which is a low work function metal other than an alkali metal. Overlying the cathode is a protective layer comprised of a mixture of at least one organic component of the organic EL medium and at least one metal having a work function in a range of from 4.0 to 4.5 eV, and capable of being oxidized in the presence of ambient moisture.

While it has been contemplated to form cathodes over the organic EL medium from the combination of lower work function (<4.0 eV) electron-injecting metals and higher work function (>4.0 eV) more stable metals by conventional vapor deposition or by high energy sputter deposition or electron beam deposition, high energy deposition has not evolved thus far as a practical approach to form cathodes. It has been observed that electron bombardment and/or ion bombardment of the organic EL medium during sputter deposition or electron beam deposition of a cathode introduces damage into the EL medium. The damage is evidenced by substantially degraded electroluminescence performance of a device when compared to the electroluminescence performance of a device having a cathode formed by conventional thermal vapor deposition.

Thus, although cathodes formed over organic light-emitting structures by sputter deposition or electron beam deposition offer potential advantages of improved adhesion and step coverage, such advantages have not been realized due to the damaging effects related to high energy deposition.

SUMMARY OF THE INVENTION

The present invention has as its purpose to minimize or eliminate damage introduced into an organic light-emitting structure or into an organic EL medium during high energy deposition of a cathode or cathodes.

Accordingly, it is an object of the present invention to provide an organic cathode buffer layer over the organic light-emitting structure as a protection layer against damage during high energy deposition of a cathode over the buffer layer.

It is another object of the invention to provide an organic light-emitting device which has an organic light-emitting structure formed over an anode, an organic cathode buffer layer formed over the light-emitting structure, a cathode disposed over the cathode buffer layer, and an electron-injecting interfacial layer formed at an interface between the buffer layer and the light-emitting structure by an electron-injecting dopant diffused from a dopant layer across the cathode buffer layer.

It is a further object of the invention to provide a method of forming an interfacial layer for use in a device by modifying the interface properties of an organic layer by diffusing an interface-modifying material.

These objects are achieved in an organic light-emitting device comprising:

a) a substrate;
b) an anode disposed over the substrate;
c) an organic light-emitting structure disposed over the anode;
d) a cathode buffer layer disposed over the organic light-emitting structure and of a material selected to permit high energy deposition of a cathode;
e) a cathode disposed over the cathode buffer layer; and
f) a dopant layer disposed between the cathode buffer layer and the cathode and being provided with an electron-injecting dopant which diffuses across the buffer layer to provide an interfacial electron-injecting layer at an interface between the light-emitting structure and the cathode buffer layer.

The drawings are necessarily of a schematic nature, since the thicknesses of the individual layers are too thin, and thickness differences of the various elements too great to permit depiction to scale or to permit convenient proportionate scaling.

High energy deposition, for example sputter deposition, of a cathode enhances the adhesion of a cathode to an organic layer. Sputter deposition also provides a cathode or cathodes conforming over underlying topological features which can be present in an organic light-emitting device having an array of light-emitting pixels formed by a plurality of laterally spaced anodes and a plurality of intersecting laterally spaced cathodes.

High energy deposition, such as sputter deposition or electron beam deposition, permits deposition of cathodes from cathode materials which cannot be readily deposited by conventional thermal vapor deposition.

In this invention, an organic cathode buffer layer, formed over an organic light-emitting structure, is stable and protects the light-emitting structure from damage during sputter deposition of the cathode. Dopant diffusion from a dopant layer of a low work function (<4.0 eV) on the cathode buffer layer forms an electron-injecting interfacial layer at the interface between the cathode buffer layer and the light-emitting structure, thus improving device performance.

The combination of a cathode buffer layer and a dopant layer over the cathode buffer layer enables the use of high energy deposition to form a cathode and the utilization of a high-work function metal or a metal-oxide to form the cathode, thus providing desirable fabrication options in device construction.

DESCRIPTION OF THE PREFERRED EMBODIMENTS

Before describing the organic light-emitting devices of the invention, two configurations of prior art organic light-emitting devices will be discussed.

Figure 1:
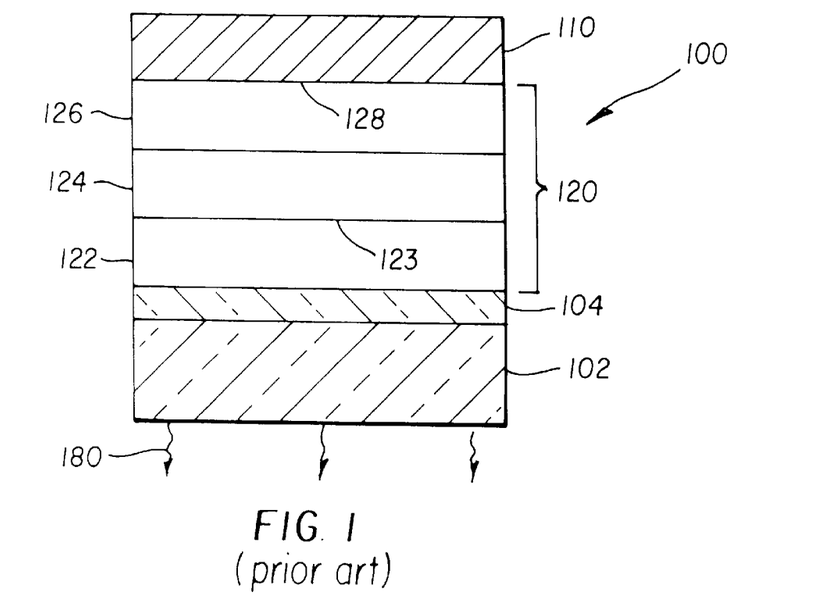
FIG. 1 is a schematic diagram of a prior art organic light-emitting device in which light is emitted through an anode and a support, and having a cathode formed by conventional thermal evaporation of an opaque cathode material composition.

In FIG. 1, an organic light-emitting device 100 has a light-transmissive substrate 102 on which is disposed a light-transmissive anode 104. An organic light-emitting structure 120 is formed between the anode 104 and a cathode 110. The organic light-emitting structure 120 is comprised of, in sequence, an organic hole-transporting layer 122, an organic light-emitting layer 124, and an organic electron-transporting layer 126. When an electrical potential difference (not shown) is applied between the anode 104 and the cathode 110 such that the anode 104 is at a more positive electrical potential with respect to the cathode 110, the cathode 110 will inject electrons into the electron-transporting layer 126 at an interface 128, and the electrons will traverse the electron-transporting layer 126 and the light-emitting layer 124 which also is capable of transporting electrons. At the same time, holes will be injected from the anode 104 into the hole-transporting layer 122, and the holes will migrate across layer 122, and will recombine with electrons at or near a junction 123 formed between the hole-transporting layer 122 and the light-emitting layer 124. Thus, the organic light-emitting device 100 can be viewed as an internal junction light-emitting device which represents a diode in a forward bias condition when the anode 104 is at a more positive potential than the cathode 110. Under these conditions, injection of holes (positive charge carriers) occurs from the anode 104 into the hole-transporting layer 122, while electrons are injected from the cathode 110 into the electron-transporting layer 126. The injected holes and electrons each migrate toward the oppositely charged electrode, and recombination and hole-electron recombination occurs at the junction 123. When a migrating electron drops from its conduction band potential to a valance band in filling a hole, energy is released as light which, as depicted in the device 100 of FIG. 1, is emitted as light 180 through the light-transmissive anode 104 and substrate 102 for viewing by an observer. The cross hatching of the cathode 110 is intended to indicate that the cathode is optically opaque.

Figure 2:
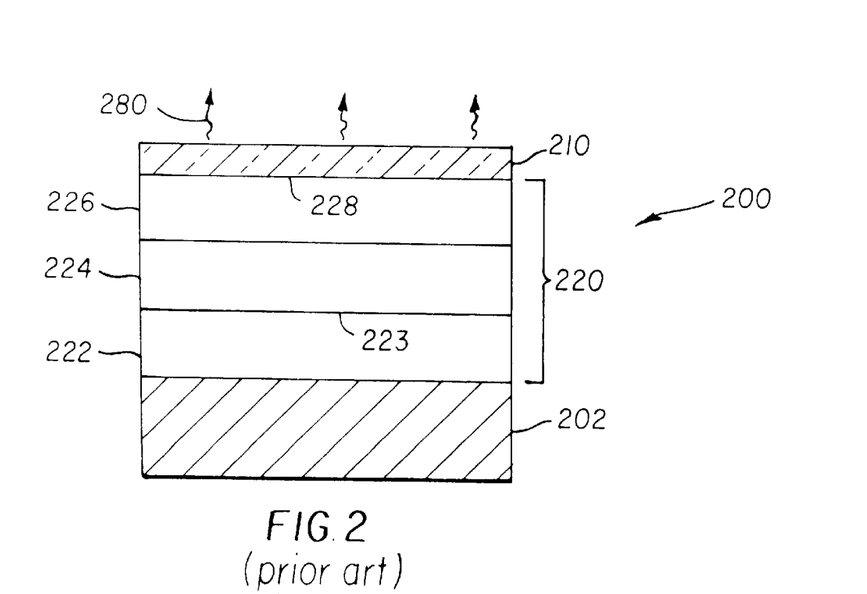
FIG. 2 is a schematic diagram of a prior art organic light-emitting device in which light is emitted through a cathode formed by conventional thermal evaporation of a light-transmissive cathode material composition.

Turning now to FIG. 2, a prior art organic light-emitting device 200 is distinct over the device 100 of FIG. 1 in that a cathode 210 is now light-transmissive, while an electrically conductive and optically opaque substrate 202 also serves as an anode electrode. The organic light-emitting structure 220 and its organic layers 222, 224, and 226, as well as the junction 223 and the interface 228 correspond to the respective elements of FIG. 1. Emitted light 280 is transmitted to an outside observer through the cathode 210 from its origin in the organic light-emitting layer 224 at or near the junction 223.

Turning again to the prior art device 100 of FIG. 1, the light-transmissive substrate 102 may be constructed of glass, quartz, or a plastic material. The anode 104 is preferably constructed of one or a combination of light-transmissive and electrically conductive metal oxides such as indium oxide, tin oxide, or optimally, indium tin oxide (ITO). As employed herein, the term "light-transmissive" means that the layer or element under discussion transmits greater than 50% of the light of at least one wavelength it receives and preferably over a 100 mm interval. In order to function as an effective hole-injecting electrode, the anode 104 must have a work function in excess of 4.0 eV. ITO has a work function of about 4.7 eV.

The organic light-emitting structure 120 is preferably constructed by sequential vapor deposition of the hole-transporting layer 122, the light-emitting layer 124, and the electron-transporting layer 126. Following the teachings of VanSlyke et al. U.S. Pat. No. 4,539,507, hereby incorporated by reference, the hole-transporting layer 122 preferably contains at least one aromatic tertiary amine.

A preferred class of selected aromatic tertiary amines are those which include at least two aromatic tertiary amine moieties. Such compounds include those represented by structural formula (I):

(I)

wherein
Q1 and Q2 are independently aromatic tertiary amine moieties, and
G is a linking group such as arylene, cyclo-alkylene, or alkylene group or a carbon to carbon bond,
at least one of Q1 and Q2 and G including a fused aromatic ring moiety as described above. In a specifically preferred form each of Q1 and Q2 includes a fused aromatic ring moiety, optimally a fused naphthyl moiety, bonded to an amine nitrogen atom. When G is an arylene moiety, it is preferably a phenylene, biphenylene or naphthylene moiety.

A particularly preferred class of triaryl-amines satisfying structural formula (I) and containing two triarylamine moieties are those satisfying structural formula (II):

(II)

where
R1 and R2 each independently represents a hydrogen atom, an aryl group, or an alkyl group or R1 and R2 together represent the atoms completing a cycloalkyl group, and
R3 and R4 each independently represents an aryl group which is in turn substituted with a diaryl substituted amino group, as indicated by structural formula (III):

(III)

wherein R5 and R6 are independently selected aryl groups. At least one of the aryl groups attached to the amine nitrogen atom of formula (III) is a fused aromatic ring moiety as described above. In a specifically preferred form at least one R5 and R6 is a fused aromatic ring moiety, optimally a naphthyl moiety.

Another preferred class of selected aromatic tertiary amines are tetraaryldiamines. Preferred tetraaryldiamines include two diarylamino groups, such as indicated by formula (III), linked through an arylene group. Preferred tetraaryldiamines include those represented by formula (IV).

(IV)

wherein
Ar, Ar1, Ar2 and Ar3 are independently selected from among phenyl, biphenyl and naphthyl moieties,
L is a divalent naphthylene moiety or $d_n$,
d is a phenylene moiety,
n is an integer of from 1 to 4, and
at least one of Ar, Ar1, Ar2 and Ar3 is a naphthyl moiety when L is $d_n$.

The various alkyl, alkylene, aryl, and arylene moieties of the foregoing structural formulae (I), (II), (III), and (IV) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. When the aryl and arylene moieties are not fused aromatic ring moieties, they are preferably phenyl and phenylene moieties.

While the entire hole transporting layer of the organic light-emitting structure 120 (220) can be formed of a single selected aromatic tertiary amine of the type described above, it is recognized that combinations of selected aromatic tertiary amines can be employed to advantage and that combinations of selected aromatic tertiary amines of the type described above with aromatic tertiary amines of the type disclosed by VanSlyke et al U.S. Pat. No. 4,720,432, i.e., aromatic tertiary amines lacking a fused aromatic ring moiety, can be employed. Apart from the differences specifically noted, the teachings of VanSlyke et al U.S. Pat. No. 4,720,432, hereby incorporated by reference, are generally applicable to the internal junction organic EL devices of this invention.

Illustrative of useful selected (fused aromatic ring containing) aromatic tertiary amines are the following:

| | |
|---|---|
| ATA-1 | 4,4'-Bis[N-(1-naphthyl)-N-phenylamino]biphenyl |
| ATA-2 | 4,4"-Bis[N-(1-naphthyl)-N-phenylamino]-p-terphenyl |
| ATA-3 | 4,4'-Bis[N-(2-naphthyl)-N-phenylamino]biphenyl |
| ATA-4 | 4,4'-Bis[N-(3-acenaphthenyl)-N-phenyl-amino]biphenyl |
| ATA-5 | 1,5-Bis[N-(1-naphthyl)-N-phenylamino]naphthalene |
| ATA-6 | 4,4'-Bis[N-(9-anthryl)-N-phenylamino]-iphenyl |
| ATA-7 | 4,4"-Bis[N-(1-anthryl)-N-phenylamino]-p-terphenyl |
| ATA-8 | 4,4'-Bis[N-(2-phenanthryl)-N-phenyl-amino]biphenyl |
| ATA-9 | 4,4'-Bis[N-(8-fluoranthenyl)-N-phenyl-amino]biphenyl |
| ATA-10 | 4,4'-Bis[N-(2-pyrenyl)-N-phenylamino]bi-phenyl |
| ATA-11 | 4,4'-Bis[N-(2-naphthacenyl)-N-phenyl-amino]biphenyl |
| ATA-12 | 4,4'-Bis[N-(2-perylenyl)-N-phenylamino]biphenyl |
| ATA-13 | 4,4'-Bis[N-(1-coronenyl)-N-phenylamino]biphenyl |
| ATA-14 | 2,6-Bis(di-p-tolylamino)naphthalene |
| ATA-15 | 2,6-Bis[di-(1-naphtyl)amino]naphthalene |
| ATA-16 | 2,6-Bis[N-(1-naphthyl)-N-(2-naphthyl)-amino]naphthalene |
| ATA-17 | N,N,N',N'-Tetra(2-naphthyl)-4,4"-di-amino-p-terphenyl |
| ATA-18 | 4,4'-Bis{N-phenyl-N-[4-(1-naphthyl)-phenyl]amino}biphenyl |
| ATA-19 | 4,4'-Bis[N-phenyl-N-(2-pyrenyl)amino]biphenyl |
| ATA-20 | 2,6-Bis[N,N-di(2-naphthyl)amine]fluorene |
| ATA-21 | 1,5-Bis[N-(1-naphthyl)-N-phenylamino]naphthalene |

Both the organic light-emitting layer 124 and the organic electron-transporting layer 126 are constructed by vapor deposition of organic materials which have electron-transporting properties, and which are capable of thin film formation. Thus, both the light-emitting layer 124 and the electron-transporting layer 126 can be constructed from one or a combination of organic electron-transporting materials, with the light-emitting layer 124 containing, in addition, a dye capable of emitting light in response to hole-electron recombination, as will be described in more detail hereinafter.

Particularly preferred thin film forming materials for use in forming the electron-transporting and light-emitting layers of the organic light-emitting device 100 are metal chelated oxinoid compounds, including chelates of oxine itself (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (V):

(V)

wherein
Me represents a metal,
n is an integer of from 1 to 3, and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

| | |
|---|---|
| CO-1 | Aluminum trisoxine |
| | [a.k.a., tris(8-quinolinol)aluminum] |
| CO-2 | Magnesium bisoxine |
| | [a.k.a., bis(8-quinolinol)magnesium] |
| CO-3 | Bis[benzo{f}-8-quinolinol]zinc |
| CO-4 | Aluminum tris(5-methyloxine) |
| | [a.k.a., tris(5-methyl-8-quinolinol)aluminum |
| CO-5 | Indium trisoxine |
| | [a.k.a., tris(8-quinolinol)indium] |
| CO-6 | Lithium oxine |
| | (a.k.a., 8-quinolinol lithium] |
| CO-7 | Gallium tris(5-chlorooxine) |
| | [a.k.a, tris(5-chloro-8-quinolinol)gallium] |
| CO-8 | Calcium bis(5-chlorooxine) |
| | a.k.a, bis(5-chloro-8-quinolinol)calcium] |
| CO-9 | Poly[zinc(II)-bis(8-hydroxy-5-quinolinyl)methane] |
| CO-10 | Dilithium epindolidione |

It is possible to modify the wavelength of emission from the light-emitting layer 124 and, in some instances, to increase the stability of the light-emitting device in operation by incorporating in the light-emitting layer 124 a dye capable of emitting light in response to hole-electron recombination. To be useful for this purpose the dye must have a bandgap no larger than that of the host material in which it is dispersed and a reduction potential less negative than that of the host material. Tang et al U.S. Pat. No. 4,769,292, the disclosure of which is hereby incorporated by reference, describes internal junction organic EL devices containing dyes selected from a variety of classes dispersed in electron-transporting host materials.

The preferred active materials forming the organic light-emitting structure 120 (220) are each film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited film forming aromatic tertiary amine as a hole transporting layer 122 (which can in turn be comprised of a triarylamine layer and a tetraaryldiamine layer), and a chelated oxinoid compound as an electron-transporting layer 126 and light-emitting layer 124, individual layer thicknesses in the range of from about 50 to 5000 Angstroms are contemplated, with layer thicknesses in the range of from 100 to 2000 Angstroms being preferred. It is generally preferred that the overall thickness of the organic device 100 to be at least about 1000 Angstroms.

Following the teachings of Tang et al. U.S. Pat. No. 4,885,211, the disclosure of which is hereby incorporated by reference, a preferred cathode 110 is one constructed of a combination of a metal having a work function less than 4.0 eV and one other metal, preferably a metal having a work function greater than 4.0 eV. The high and low work function metals can be employed in extremely wide proportions, ranging from <1 percent to >99 percent of the low work function metal with another metal, preferably a higher work function metal (e.g., a metal having a work function greater than 4.0 eV) forming the balance of the cathode. The Mg:Ag cathodes of Tang et al U.S. Pat. No. 4,885,211 constitute one preferred cathode construction. Aluminum and magnesium cathodes with magnesium constituting at least 0.05 (preferably at least 0.1) percent and aluminum constituting at least 80 (preferably at least 90) percent constitute another preferred cathode construction. The aluminum and magnesium cathodes are the subject matter of the VanSlyke et al U.S. Pat. No. 5,059,062, the disclosure of which is hereby incorporated by reference.

While the highest electron-injecting efficiencies from the cathode 110 across the interface 128 into the electron-transporting layer 126 are obtained from a cathode containing an alkali metal as the low work function metal, alkali metals have been excluded because they are too unstable for convenient use in a cathode 110 (or in a cathode 210) of prior art devices 100 and 200.

A listing of available low work function metal choices (other than alkali metals) for the cathodes 110 and 210, as well as available high work function metal choices for the cathodes, and for the anode 202 of FIG. 2, is given by Tang et al. U.S. Pat. No. 4,769,292, the disclosure of which is hereby incorporated by reference.

As indicated previously, the cathodes 110 and 210 are formed by conventional vapor co-deposition from one vapor source of a low (<4.0 eV) work function cathode material and from another vapor source of a high (>4.0 eV) work function cathode material.

Figure 3:
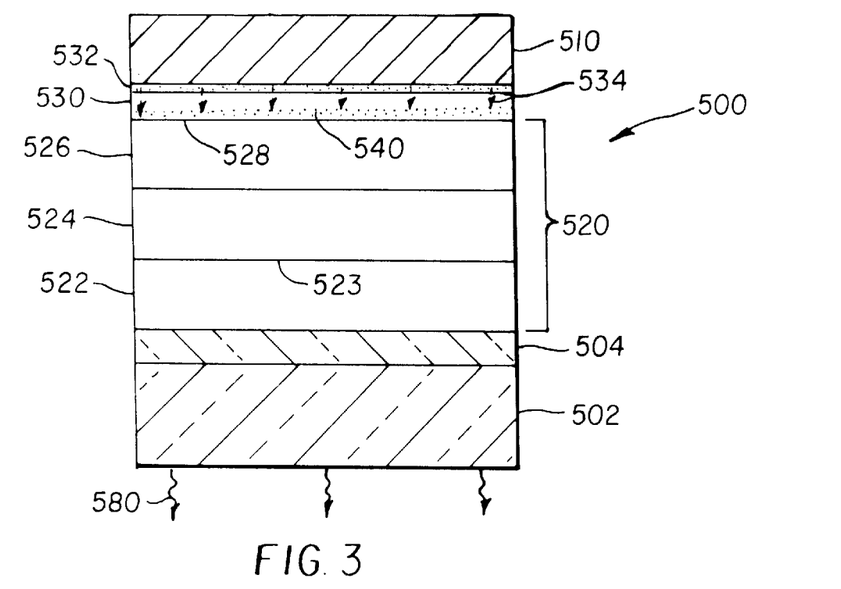
FIG. 3 is a schematic diagram of an organic light-emitting device in accordance with the present invention in which light is emitted through an anode and a support, and having a cathode formed by high energy deposition over an organic cathode buffer layer across which an electron-injecting dopant is diffused from a dopant layer to an interface between the buffer layer and an electron-transporting layer of an organic light-emitting structure.

Turning now to FIG. 3, an organic light-emitting device 500 is constructed in accordance with the present invention. A light transmissive substrate 502, a light-transmissive anode 504, and an organic light-emitting structure 520, comprised of, in sequence, an organic hole-transporting layer 522, an organic light-emitting layer 524, and an organic electron-transporting layer 526 correspond to the elements 102, 104, 120, 122, 124, and 126, respectively, of the prior art device 100 of FIG. 1. Similarly, the junction 523 and the interface 528 as well as the emitted light 580, correspond to the junction 123, the interface 128, and the emitted light 180 of the prior art device 100 of FIG. 1. Accordingly, the aforementioned corresponding elements of the organic light-emitting device 500 and their construction and function require no further description.

Figure 4:
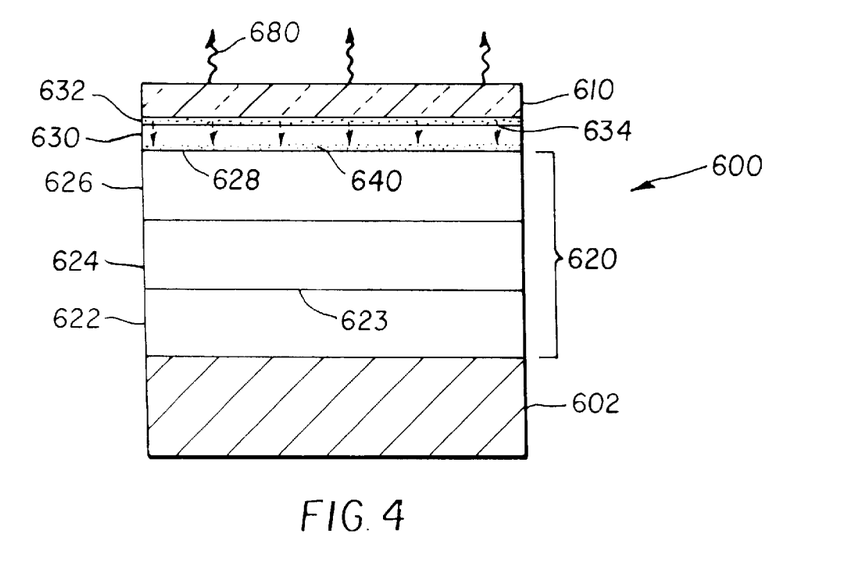
FIG. 4 is a schematic diagram of an organic light-emitting device in accordance with the present invention in which light is emitted through a cathode, and having the cathode formed by high energy deposition over an organic cathode buffer layer across which an electron-injecting dopant is diffused from a dopant layer to an interface between the buffer layer and an electron-transporting layer of an organic light-emitting structure.

Likewise, the organic light-emitting device 600 of FIG. 4 has an optically opaque substrate and anode electrode 602 over which is disposed an organic light-emitting structure 620 which is comprised of, in sequence, an organic hole-transporting layer 622, an organic light-emitting layer 624, and an organic electron-transporting layer 626, a junction 623, and interface 628, each of these elements corresponding in the construction and function to the construction and function of elements 202, 220, 222, 223, 224, 226, and 228, respectively, of the prior art device 200 of FIG. 2.

Viewing FIGS. 3 and 4 together, it has been found unexpectedly that an organic cathode buffer layer 530 (630) formed over the electron-transporting layer 526 (626) permits high energy deposition of a cathode 510 (610) on the device 500 (600) by sputter deposition or by electron beam deposition. Surprisingly, the organic cathode buffer layer 530 (630), which has a preferred thickness in a range of 5–100 nm, is an effective protection layer which protects the organic light-emitting structure 520 (620) from damage induced by electron bombardment or ion bombardment present during a high energy deposition of a cathode, such as sputter deposition or electron beam deposition.

A dopant layer 532 (632) is formed over the organic cathode buffer layer 530 (630) by conventional thermal vapor deposition or by high energy deposition. The dopant layer 532 (632) consists of a dopant material, shown schematically in dotted outline, which has a work function lower than 4.0 eV, and which is capable to diffuse from the dopant layer across the cathode buffer layer 530 (630), as indicated schematically by the dashed arrows 534 (634), so as to provide an electron-injecting interfacial dopant layer 540 (640) at an interface 528 (628) between the electron-transporting layer 526 (626) and the cathode buffer layer 530 (630).

A cathode 510 (610) is provided over the dopant layer 532 (632) by thermal evaporation or high energy deposition. The cathode-forming material or materials can be selected to have a work function greater than 4.0 eV, thereby providing a cathode which is chemically and mechanically stable during storage and operation of the devices. The high work function cathode material preferably consists of elemental metals or of metal alloys to form the optically opaque cathode 510 of FIG. 3, and preferably consists of electrically conductive and light transmissive metal oxides to form the light transmissive cathode 610 of FIG. 4.

It is estimated that the interfacial electron-injecting layer 540 (640) can be as thin as a few atomic monolayers of the electron-injecting dopant to provide effective electron injection into the organic electron-transporting layer 526 (626) at the interface 528 (628) when the cathode is biased at a negative electrical potential with respect to the anode. Such interfacial electron-injecting layers can be readily achieved by diffusion of only a portion of the electron-injecting dopant from the dopant layer 532 (632) across the cathode buffer layer 530 (630). Alternatively, the dopant layer 532 (632) can be made sufficiently thin (0.5–2.0 nm) so that all of the dopant of the layer 532 (632) diffuses across the cathode buffer layer 530 (630) to form the interfacial electron-injecting layer 540 (640).

Preferred electron-injecting dopant materials, capable of diffusion across the cathode buffer layer 530 (630), are selected from the Periodic Table groups IA and IIA. Examples of such materials are as cesium, lithium, calcium and magnesium.

At least a portion of the aforementioned dopants diffuses from the dopant layer 532 (632) across the organic cathode buffer layer 530 (630) during the high energy cathode deposition in which the buffer layer, and the cathode being formed, may be at a temperature in a range of 20–80° C. An actually measured temperature depends on several factors including cathode deposition conditions such as, for example, deposition power, deposition rate, deposition duration, and on the presence or absence of temperature-controlled substrate mounting means during the cathode deposition. At any rate, the cathode buffer layer 530 (630), and the cathode 510 (610) being formed, are maintained during the cathode deposition at a temperature sufficient to diffuse at least a portion of the dopant from the dopant layer 532 (632) across the cathode buffer layer 530 (630) to provide the interfacial electron-injecting layer 540 (640).

It has now been found that an organic cathode buffer layer 530 (630), effective as a protection layer, can be formed of a porphyrinic compound by conventional thermal vapor deposition at a preferred thickness in a range of 5–100 nm. A porphyrinic compound is any compound, natural or synthetic, which is derived from or includes a porphyrin structure, including porphine itself. Any of the porphyrinic compounds disclosed by Adler U.S. Pat. No. 3,935,031 or Tang U.S. Pat. No. 4,356,429, the disclosures of which are hereby incorporated by reference, can be employed.

Preferred porphyrinic compounds are those of structural formula (VI):

(VI)

wherein

Q is —N= or —C(R)=,

M is a metal, metal oxide, or metal halide,

R is hydrogen, alkyl, aralkyl, aryl, or alkaryl, and

T1 and T2 represent hydrogen or together complete an unsaturated 6-membered ring, which can include substituents, such as alkyl or halogen. Preferred 6-membered rings are those formed of carbon, sulfur, and nitrogen ring atoms. Preferred alkyl moieties contain from about 1 to 6 carbon atoms while phenyl constitutes a preferred aryl moiety.

In an alternative, preferred form the porphyrinic compounds differ from those of structural formula (VI) by substitution of two hydrogen for the metal atom, as indicated by formula (VII):

(VII)

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:

| | |
|---|---|
| PC-1 | Porphine |
| PC-2 | 1,10,15,20-Tetraphenyl-21H,23H-porphine copper (II) |
| PC-3 | 1,10,15,20-Tetraphenyl-21H,23H-porphine zinc (II) |
| PC-4 | 5,10,15,20-Tetrakis(pentafluorophenyl)-21H,23H-porphine |
| PC-5 | Silicon phthalocyanine oxide |
| PC-6 | Aluminum phthalocyanine chloride |
| PC-7 | Phthalocyanine (metal free) |
| PC-8 | Dilithium phthalocyanine |
| PC-9 | Copper tetramethylphthalocyanine |
| PC-10 | Copper phthalocyanine |
| PC-11 | Chromium phthalocyanine fluoride |
| PC-12 | Zinc phthalocyanine |
| PC-13 | Lead phthalocyanine |
| PC-14 | Titanium phthalocyanine oxide |
| PC-15 | Magnesium phthalocyanine |
| PC-16 | Copper octamethylphthalocyanine |

A cathode buffer layer consisting of a porphyrinic compound not only serves as a protection layer for the underlying light-emitting structure 520 (620) but also permits diffusion of the electron-injecting dopant thereacross.

A cathode buffer layer consisting of a phthalocyanine, particularly of a metal containing phthalocyanine, and specifically a copper phthalocyanine, is substantially light-transmissive even at a buffer layer thickness of approximately 250 nm, i.e. a thickness significantly greater than a preferred buffer layer thickness in a range of 5–100 nm.

Figure 5:
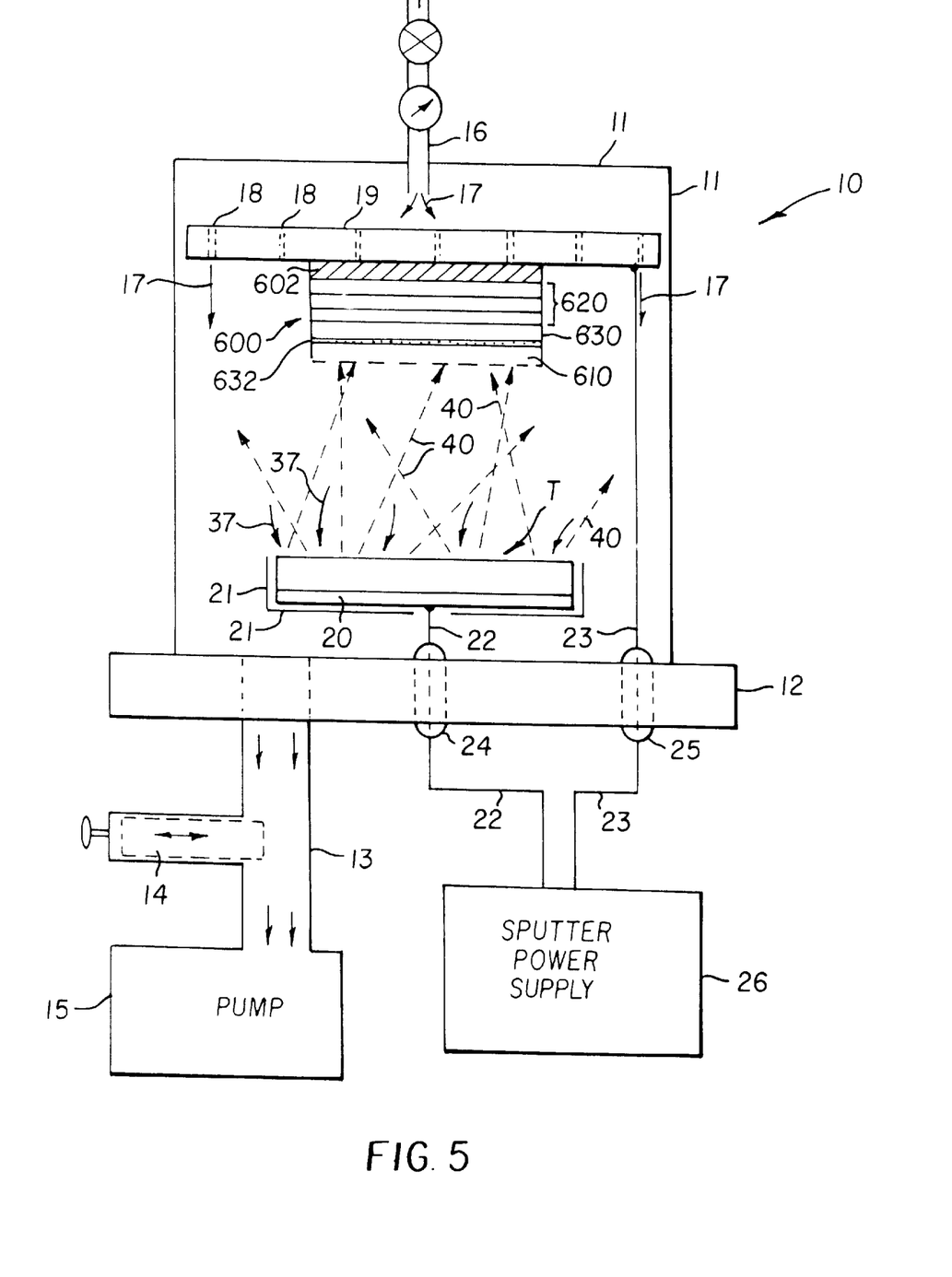
FIG. 5 is a schematic diagram of a sputter deposition system useful for high energy deposition of a cathode over an organic cathode buffer layer of an organic light-emitting device, in accordance with the present invention.

Turning now to FIG. 5, there is shown a schematic diagram of a sputter deposition system 10 useful for depositing a cathode on an organic light-emitting device 600, which is shown in FIG. 5 for illustrative purposes only. The system 10 has a chamber 11 which forms a vacuum seal (not shown) to a base plate 12. A pump conduit 13 extends through the base plate 12 and is connected to a pump 15 via a control valve 14. A gas conduit 16 shown in an upper portion of the chamber 11 introduces into the chamber a regulated flow of a sputter gas 17, for example, an argon gas or a xenon gas. The sputter gas 17 flows through gas flow distributors 18 formed in a support plate 19, whereby a flow rate of the sputter gas 17 is determined by several factors, including a gas flow rate entering the chamber through the gas conduit 16 and a gas flow rate extracted from the chamber by the pump 15 via the pump conduit 13. The device 600 of FIG. 4 is shown schematically as being fixedly attached at its substrate 602 to the support plate 19. A sputter power supply 26, which can be a DC power supply or an RF power supply, is connected by a lead 23, passing through a feedthrough 25, to the support plate 19, and the sputter power supply 26 is connected via a lead 22, through a feedthrough 24, to a target backing plate 20 which supports a target T. As is well known, the target T and the target backing plate 20 are shielded by a shield 21, also referred to as a dark space shield by those skilled in the art of sputter deposition systems.

Ions of the sputter gas 17, shown by curved bold arrows 37, are bombarding the target T and are sputtering off the target energetic atoms or molecules, shown by dashed arrows designated at 40. The atoms or molecules 40 correspond in composition to the composition of the target T, and form the cathode 610 over the cathode buffer layer 630, as indicated schematically by the dashed upper surface of the cathode 610 during its formation by high energy sputter deposition.

A sputter deposition target T or an electron beam target (not shown) can be formulated and constructed as a composite target by those skilled in this art. A composite target can be an alloy target containing at least two selected cathode materials of a work function greater than 4.0 eV. For example, alloy targets of aluminum and silicon or of chromium and nickel can be readily fabricated. Composite targets from which light-transmissive layers can be formed include indium tin oxide (ITO), aluminum- or indium-doped zinc oxide and cadmium tin oxide.

It will be appreciated from the foregoing description of the embodiments of the invention that interface properties between an organic layer and an overlying organic buffer layer can be modified significantly by diffusing a material through the organic buffer layer to provide an interfacial layer between the organic layer and the buffer layer by selecting the material to appropriately modify the interface properties.

EXAMPLES

The following examples are presented for a further understanding of the invention. For purposes of brevity, the materials and the layers formed therefrom will be abbreviated as given below:

| | |
|---|---|
| ITO | indium tin oxide (anode) |
| CuPc | copper phthalocyanine (cathode buffer layer; and a hole-injecting layer disposed over the anode) |
| NPB | 4,4'-bis-[N-(1-naphthyl)-N-phenylamino]-bi-phenyl (hole-transporting layer) |
| Alq | tris(8-quinolinolato-N12,08)-aluminum (electron-transporting layer; functioning here as a combined light-emitting layer and electron-transporting layer) |
| MgAg | magnesium:silver at a ratio of 10:1 by volume (cathode) |
| Ag | silver (cathode) |
| Al | aluminum (cathode) |
| Li | lithium (electron-injecting dopant layer disposed over cathode buffer layer) |

I. Preparation of an organic light-emitting structure

An organic light-emitting structure was constructed in the following manner:

a) a light-transmissive anode of ITO-coated glass was ultrasonicated in a commercial detergent, rinsed in deionized water, degreased in toluene vapor, and contacted by a strong oxidizing agent;

b) a 15 nm thick CuPc hole-injecting layer was deposited on the anode by conventional thermal vapor deposition;

c) a 65 nm thick NPB hole-transporting layer was deposited on the CuPc layer by conventional thermal vapor deposition;

d) a 75 nm thick Alq electron-transporting and light-emitting layer was deposited on the NPB layer by conventional thermal vapor deposition.

The above structure serves as a base configuration for each of the following examples, and is given in abbreviated form as ITO/CuPc(15)/NPB(65)/Alq(75).

Example A

An organic light-emitting device was constructed as follows: a MgAg cathode was deposited on the Alq (75) layer of the base configuration by conventional thermal vapor co-deposition from two sources (Mg;Ag) to a thickness of about 200 nm, so as to provide a prior art cathode.

Example B

An organic light-emitting device was constructed as follows: a CuPc cathode buffer layer was deposited on the Alq(75) layer of the base configuration by conventional thermal vapor deposition to a thickness of 15 nm. A MgAg cathode was deposited on the CuPc cathode buffer layer by the deposition of Example A.

Example C

An organic light-emitting device was constructed as follows: a CuPc cathode buffer layer was deposited on the Alq(75) layer of the base configuration as in Example B. A 1 nm (10 Angstrom) thick Li layer was deposited on the CuPc cathode buffer layer by conventional thermal vapor deposition. A MgAg cathode was deposited on the Li layer by the deposition of Example A.

Example D

An organic light-emitting device was constructed as in Example C, except that the MgAg cathode was replaced by an Al cathode formed on the Li layer by conventional thermal vapor deposition to a thickness of 100 nm.

Example E

An organic light-emitting device was constructed as in Example C, except that the MgAg cathode was replaced by an Al cathode formed on the Li layer by conventional thermal vapor deposition to a thickness of 30 nm.

Example F

An organic light-emitting device was constructed as follows: a 15 nm thick CuPc cathode buffer layer was deposited on the Alq(75) layer of the base configuration as in Example B. A 100 nm thick Al cathode was deposited on the CuPc buffer layer by electron beam (e-beam) deposition.

Example G

An organic light-emitting device was constructed in the following manner: a 15 nm thick CuPc cathode buffer layer was deposited on the Alq(75) layer of the base configuration as in Example B. A 1 nm thick Li layer was deposited on the CuPc layer by conventional thermal vapor deposition. A 100 nm thick Al cathode was deposited on the Li layer by conventional thermal vapor deposition.

Example H

An organic light-emitting device satisfying the requirements of the invention was constructed in the following manner: a 15 nm thick CuPc cathode buffer layer was deposited on the Alq(75) layer of the base configuration as in Example B. A 1 nm thick Li layer was deposited on the CuPc layer by conventional thermal vapor deposition. A 100 nm thick Al cathode was deposited on the Li layer by electron beam (e-beam) deposition.

Example I

An organic light-emitting device satisfying the requirements of the invention was constructed in the following manner: a 15 nm thick CuPc cathode buffer layer was deposited on the Alq(75) layer of the base configuration as in 20 Example B. A 1 nm thick Li layer was deposited on the CuPc layer by conventional thermal vapor deposition. A 200 nm thick MgAg cathode was sequentially deposited on the Li layer by resistive heating.

Example J

An organic light-emitting device satisfying the requirements of the invention was constructed in the following manner: a 15 nm thick CuPc cathode buffer layer was deposited on the Alq(75) layer of the base configuration as in Example B. A 1 nm thick Li layer was deposited on the CuPc layer by conventional thermal vapor deposition. A 100 nm thick ITO cathode was sequentially deposited on the Li layer by sputtering without breaking the vacuum.

Each of the devices was tested by applying a drive voltage between the anode and the cathode such that the anode was positive with respect to the cathode. A current-drive voltage relationship was determined, as shown in FIGS. 6A, 7A, and 8A, and a relationship between electroluminescence (EL) light output and drive current (at a given drive voltage) was determined, as shown in FIGS. 6B, 7B, and 8B.

Figure 6A:
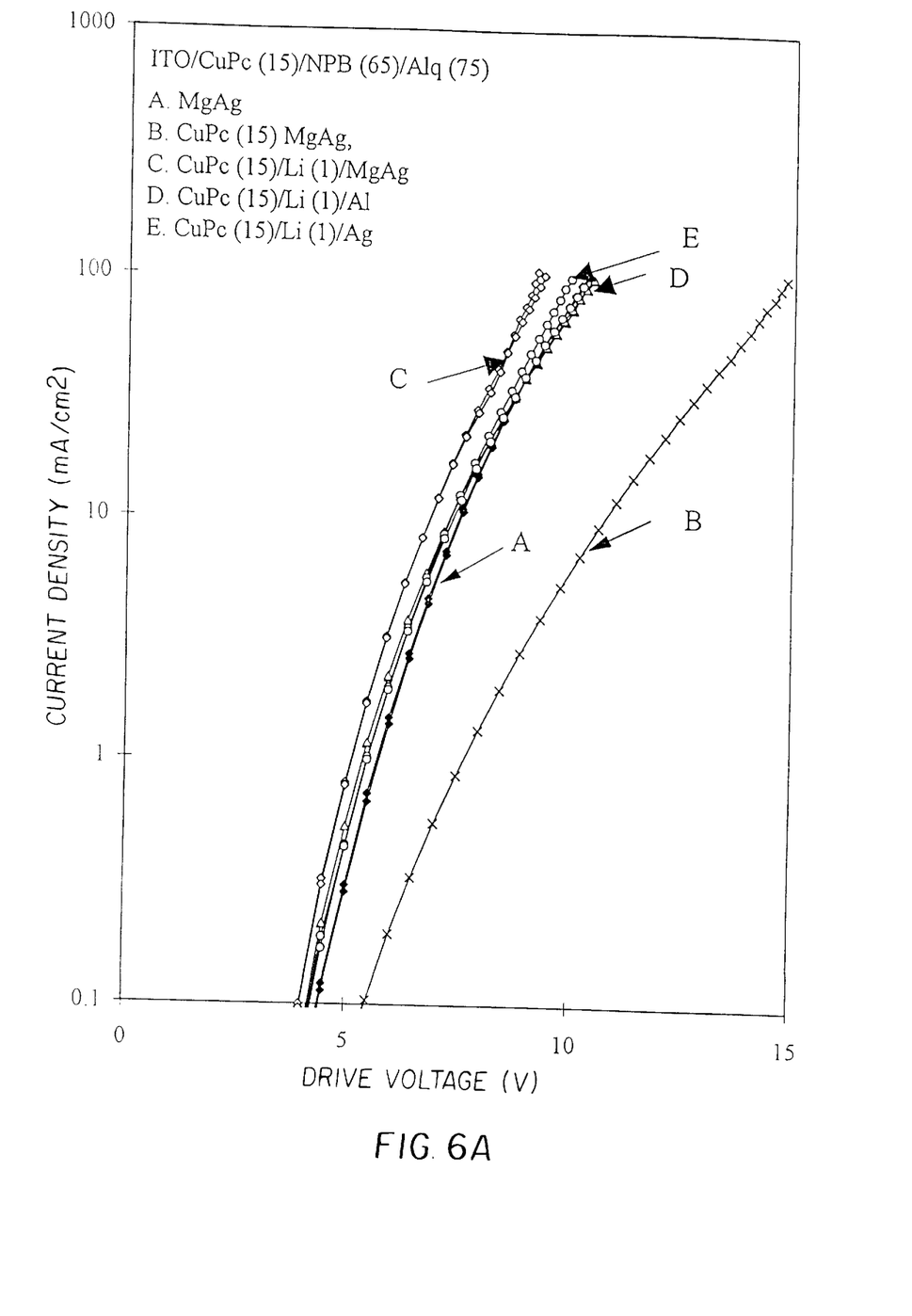
FIG. 6A shows in graphic form the current-voltage relationships of organic light-emitting devices constructed with and without an organic cathode buffer layer, with and without an electron-injecting dopant layer, and with a different cathode layer.
Figure 6B:
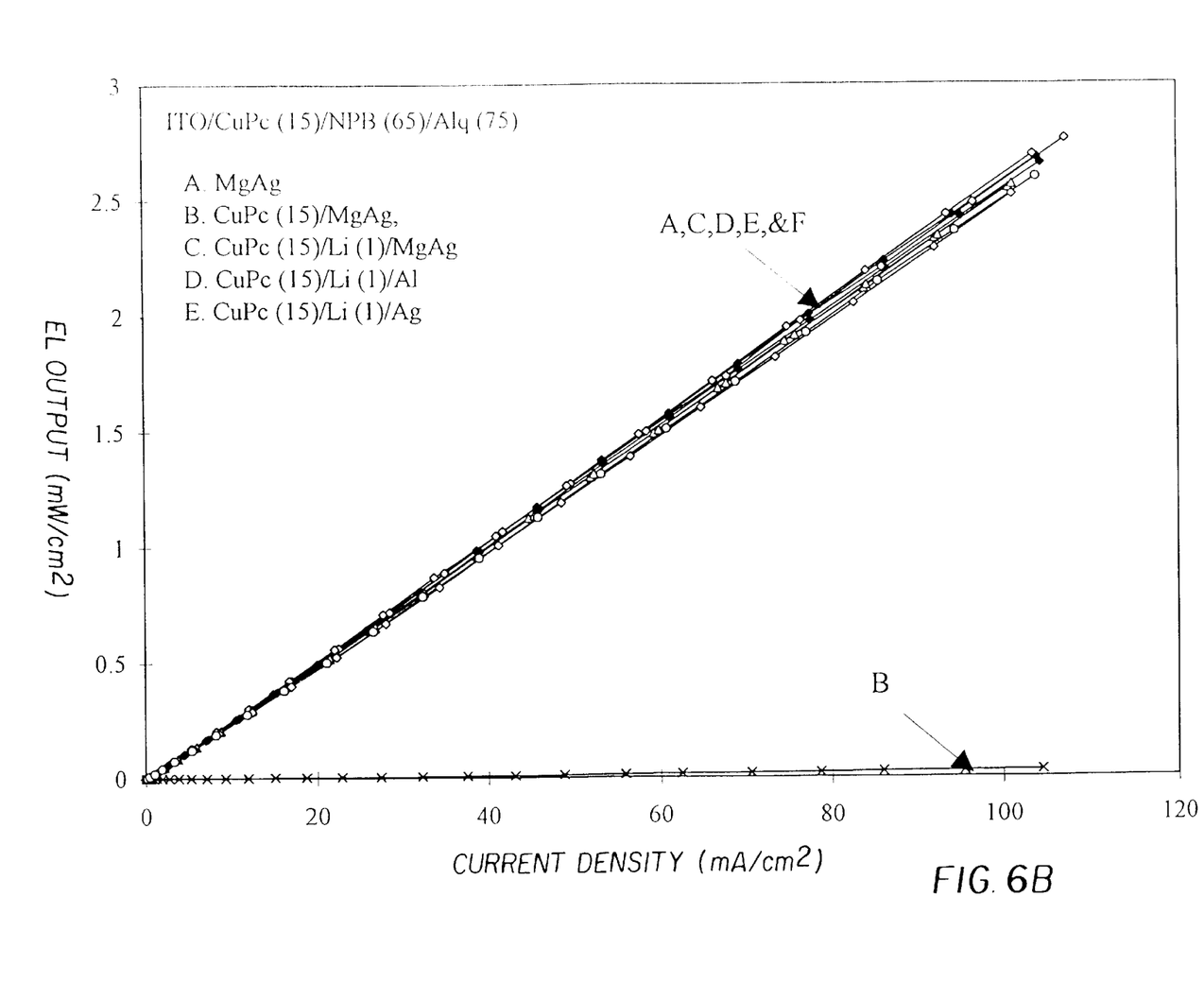
FIG. 6B shows in graphic form the relationship between an electroluminescence light output and a drive current of the devices of FIG. 6A.

Viewing FIGS. 6A and 6B together, it is apparent that a CuPc layer interposed between Alq and MgAg in Example B severely deteriorated the current-drive voltage relationship, as compared to the prior art in Example A with the MgAg cathode deposited directly on the Alq (75) layer of the base configuration. It is more surprising that the EL output of the device in Example B is almost naught, while the device in Example A showed strong electroluminescence with an efficiency of about 2.5×10 W/A. The pronounced differences between the two devices clearly indicate that there is an electron injection barrier between CuPc and Alq, such that the electrons and holes would recombine in the CuPc near the CuPc-Alq interface, thus generating extremely weak electroluminescence.

When a 1 nm thick Li was deposited on the CuPc, the devices with a MgAg, an Al, or an Ag as the cathode in FIGS. 6A and 6B show almost identical electrical and optical characteristics, as compared to the prior art in Example A. Measurements on Li profiles by x-ray photoelectron spectroscopy revealed some Li in the CuPc layer and at the CuPc-Alq interface. The presence of Li at the interface substantially lowered the electron injection barrier. As a result electrons and holes recombined in Alq at the NPB-Alq interface, thus generating strong electroluminescence. It is also important to note from Examples C, D, and E that the combination of a CuPc layer and a thin Li layer enables the utilization of a high-work-function metal to form an effective cathode. The work-function of Al (4.24 eV) or Ag (4.74 eV) is considerably higher that that of Mg (3.66 eV).

Figure 7A:
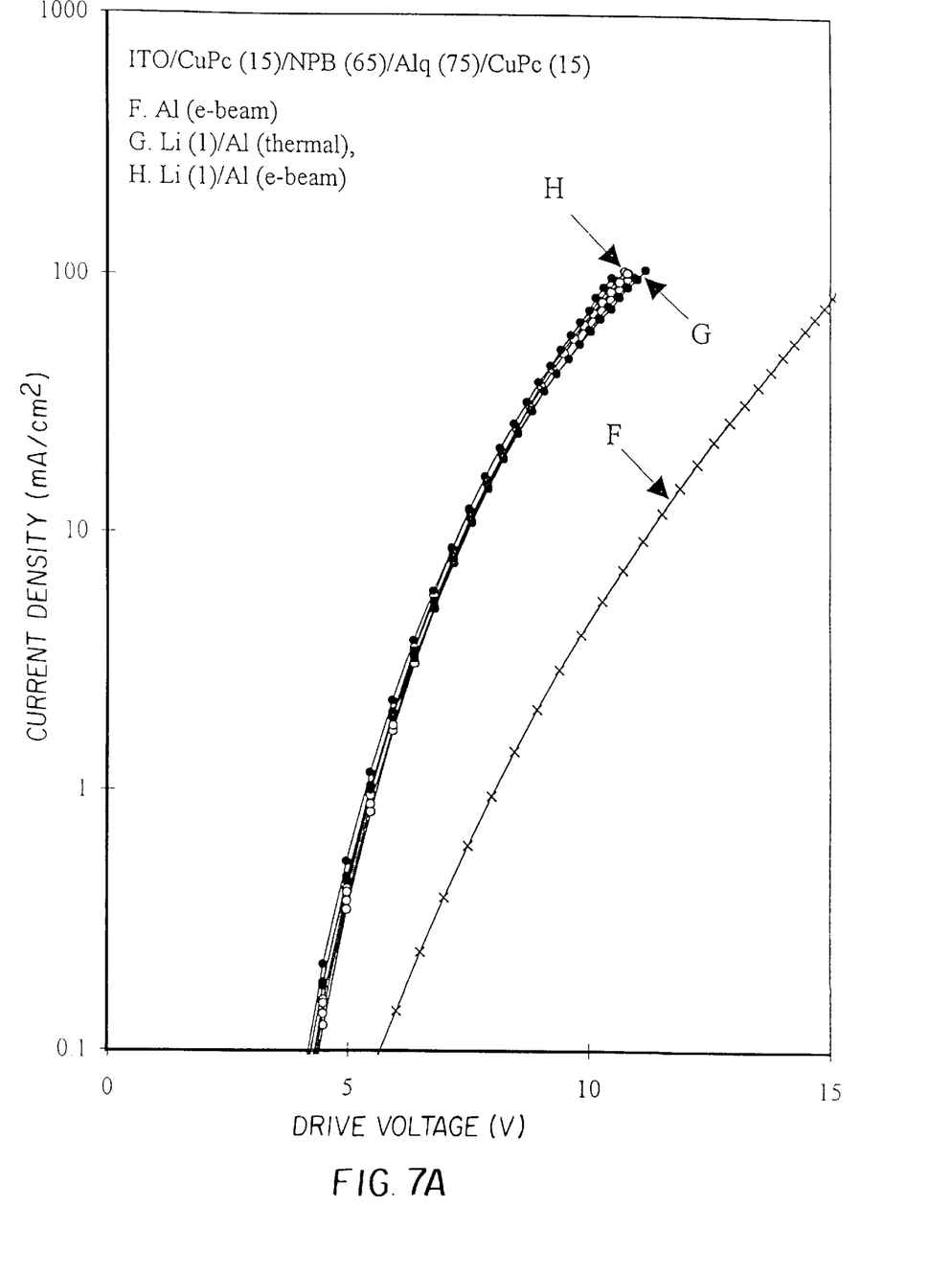
FIG. 7A shows in graphic form the current-voltage relationships of organic light-emitting devices constructed with an organic cathode buffer layer, with and without an electron-injecting dopant layer, and with an Al cathode prepared by resistive heating or e-beam evaporation.
Figure 7B:
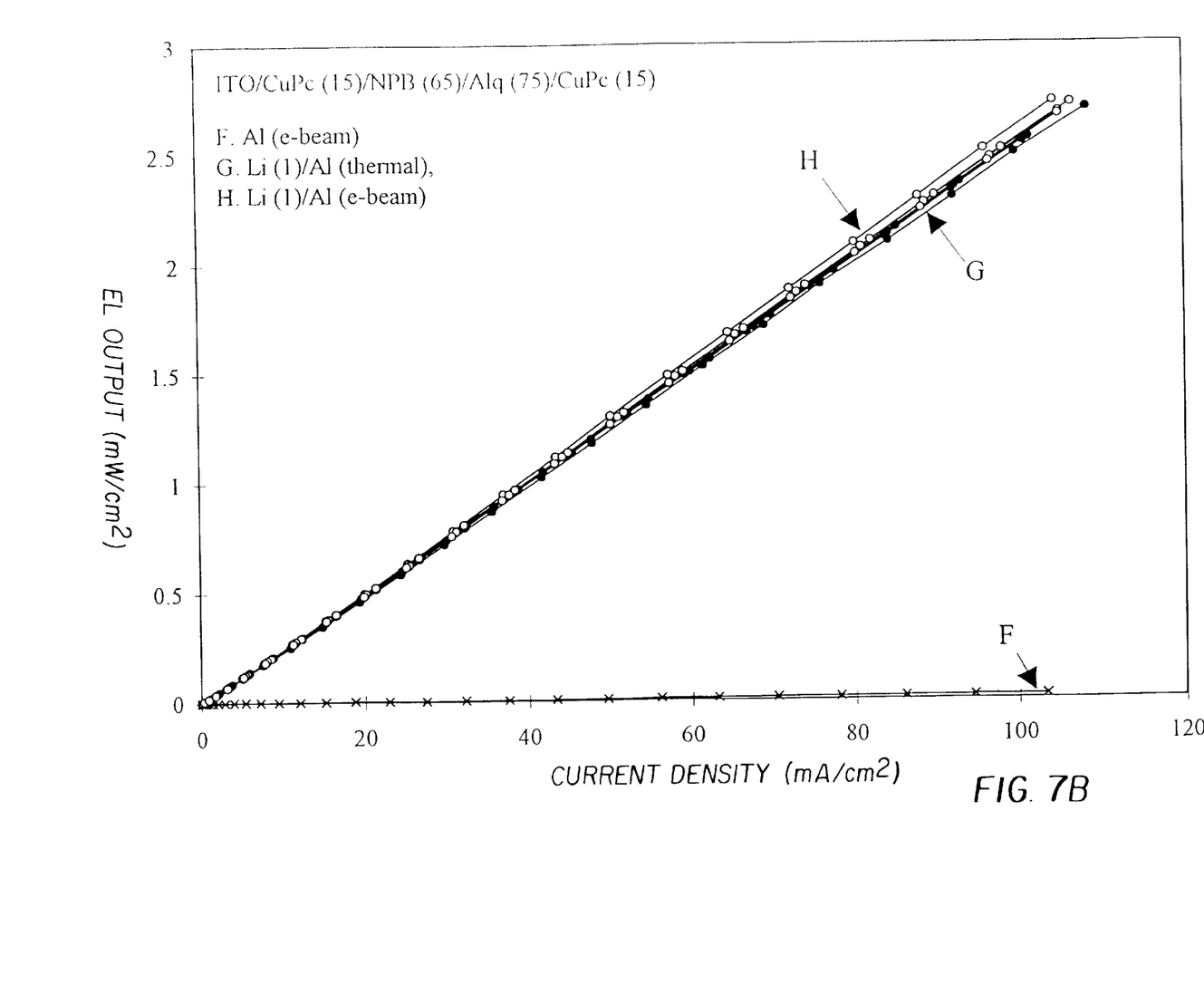
FIG. 7B shows in graphic form the relationship between an electroluminescence light output and a drive current of the devices of FIG. 7A.
Figure 8A:
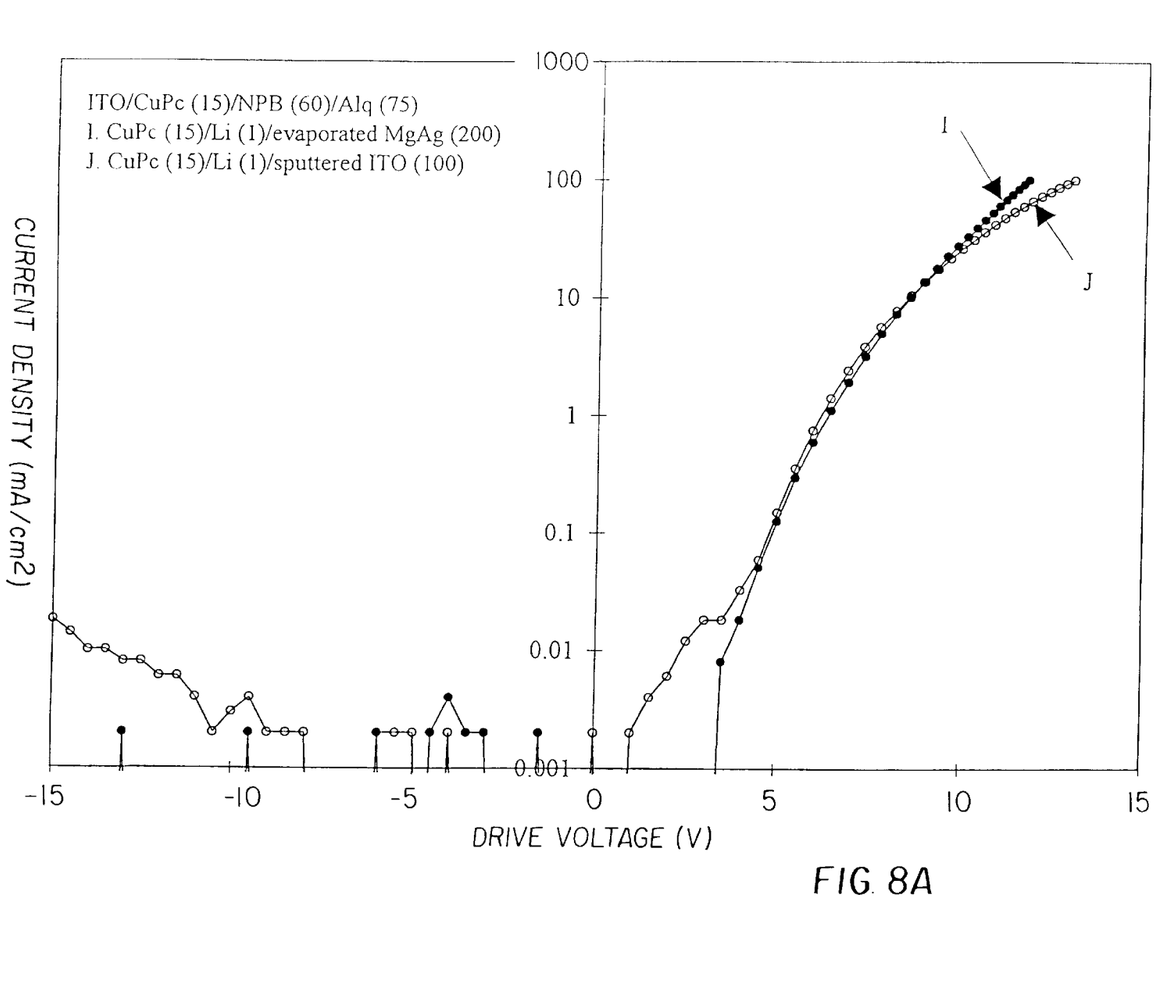
FIG. 8A shows in graphic form the current-voltage relationships of organic light-emitting devices constructed with an evaporated MgAg cathode on Alq and with an sputtered ITO cathode on a Li-coated cathode buffer layer.
Figure 8B:
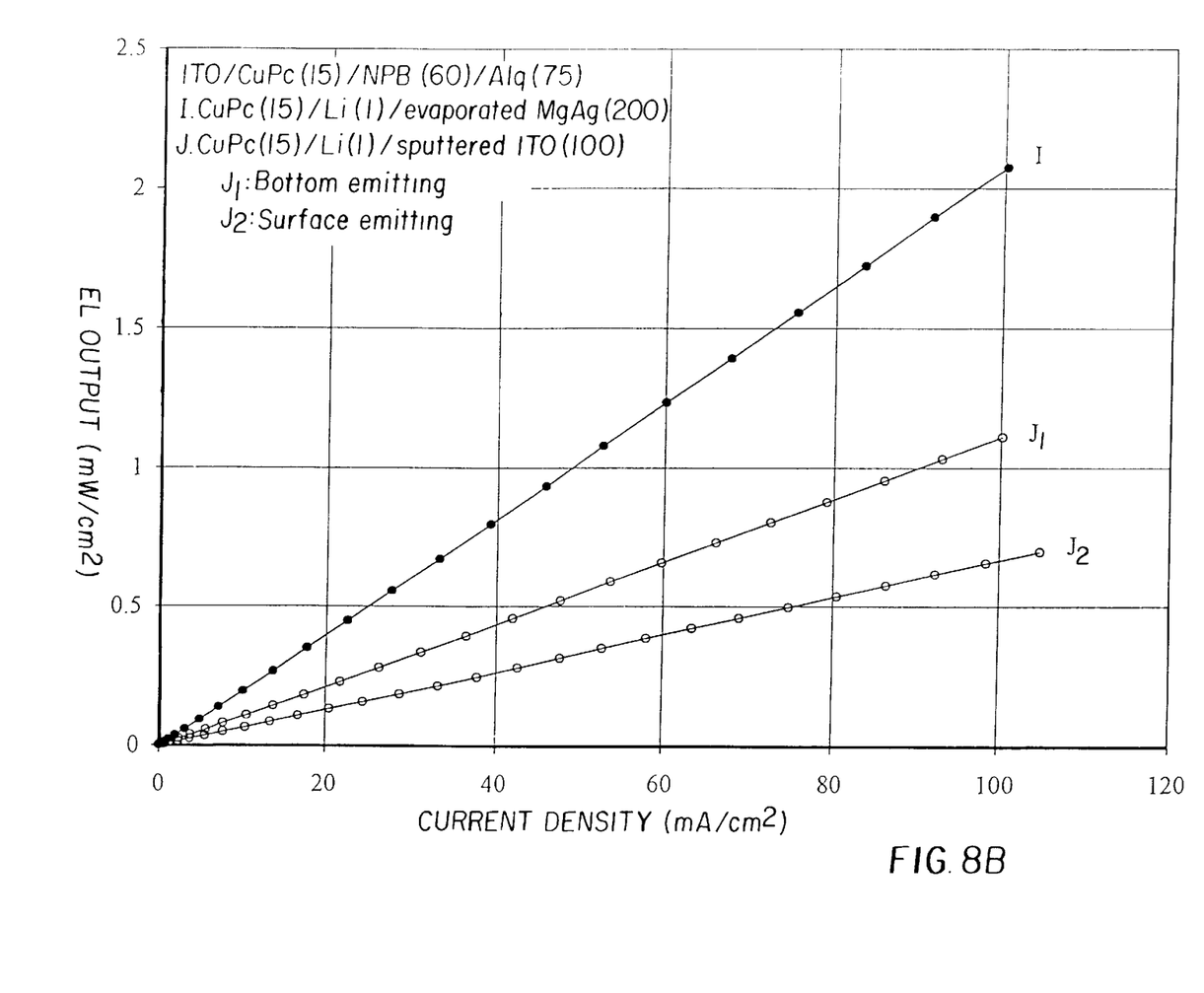
FIG. 8B shows in graphic form the relationship between an electroluminescence light output and a drive current of the devices of FIG. 8A.

Turning now to FIGS. 7A and 7B, each of devices F, G, and H has a 15 nm thick CuPc cathode buffer layer and a 100 nm thick Al surface layer, but the results of device F are profoundly different from those of devices G and H. This indicates that the insertion of a Li dopant layer between the cathode buffer layer and the cathode layer is extremely important. It is also of importance to note that no profound differences between devices G and H in electrical and optical characteristics. It is, therefore, apparent that the e-beam deposition of Al did not cause substantial damages to the device when a CuPc layer is used as a protective layer. In contrast, when Al was e-beam deposited on the Alq (75) layer of the base configuration, the resulting device was severely damaged with a high drive voltage and a low EL efficiency.

FIGS. 8A and 8B show the data taken from the devices in Examples I and J. In Example I, a cathode buffer layer CuPc, a thin dopant layer Li, and a thermally evaporated MgAg cathode were used, while in Example J, a CuPc layer, a Li layer, and a sputtered ITO were used. In FIG. 8A the two devices exhibit almost the same electrical characteristics, irrespective of the pronounced difference in work function between MgAg and ITO. When ITO is used as a top electrode, the light can emit from the bottom surface as well as from the top surface. When MgAg is used as a cathode the light can only come from the bottom surface, but it is substantially enhanced due to optical reflection from the MgAg cathode. In FIG. 8B, J1 represents the light measured at the bottom surface and J2 represents the light at the top surface. The sum of J1 and J2 was found to be close to the value of I, indicating no degradation in EL outputs when the cathode was prepared by sputtering. It is of importance to note that when a device was constructed similarly to Example J, but no Li was interposed between CuPc and ITO, both electrical and optical properties of the devices were severely degraded, as compared to the device in Example J with a Li dopant layer.

The invention has been described in detail with particular reference to certain preferred embodiments thereof, but it will be understood that variations and modifications can be effected within the spirit and scope of the invention.

| PARTS LIST | |
|---|---|
| 10 | sputter deposition system |
| 11 | chamber |
| 12 | base plate |
| 13 | pump conduit |
| 14 | control valve |
| 15 | pump |
| 16 | gas conduit |
| 17 | sputter gas |
| 18 | gas flow distributors |
| 19 | support plate |
| 20 | target backing plate |
| 21 | shield |
| 22 | lead |
| 23 | lead |
| 24 | feedthrough |
| 25 | feedthrough |
| 26 | sputter power supply |
| 37 | gas ions |
| 40 | sputtered target atoms or molecules |
| T | sputter target |
| 100 | organic light-emitting device (prior art) |
| 102 | light-transmissive substrate |
| 104 | light-transmissive anode |
| 110 | optically opaque cathode |
| 120 | organic light-emitting structure |
| 122 | hole-transporting layer |
| 123 | junction |
| 124 | light-emitting layer |
| 126 | electron-transporting layer |
| 128 | interface |
| 180 | emitted light |
| 200 | organic light-emitting device (prior art) |
| 202 | optically opaque substrate, and anode |
| 210 | light-transmissive cathode |
| 220 | organic light-emitting structure |
| 222 | hole-transporting layer |
| 223 | junction |
| 224 | light-emitting layer |
| 226 | electron-transporting layer |
| 228 | interface |
| 280 | emitted light |
| 500 | organic light-emitting device |
| 502 | light-transmissive substrate |
| 504 | light-transmissive anode |
| 510 | optically opaque cathode |
| 520 | organic light-emitting structure |
| 522 | hole-transporting layer |
| 523 | junction |
| 524 | light-emitting layer |
| 526 | electron-transporting layer |

-continued

PARTS LIST

| | |
|---|---|
| 528 | interface |
| 530 | organic cathode buffer layer |
| 532 | dopant layer |
| 534 | arrows indicating dopant diffusion |
| 540 | interfacial electron-injecting dopant layer |
| 580 | emitted light |
| 600 | organic light-emitting device |
| 602 | optically opaque substrate, and anode |
| 610 | light-transmissive cathode |
| 620 | organic light-emitting structure |
| 622 | hole-transporting layer |
| 623 | junction |
| 624 | light-emitting layer |
| 626 | electron-transporting layer |
| 628 | interface |
| 630 | organic cathode buffer layer |
| 632 | dopant layer |
| 634 | arrows indicating dopant diffusion |
| 640 | interfacial electron-injecting dopant layer |
| 680 | emitted light |

What is claimed is:

1. An organic light-emitting device comprising:
  a) a substrate;
  b) an anode disposed over the substrate;
  c) an organic light-emitting structure disposed over the anode;
  d) a cathode buffer layer includes a porphyrinic compound disposed over the organic light-emitting structure and formed of a material selected to permit high energy deposition of a cathode;
  e) a cathode disposed over the cathode buffer layer; and
  f) a dopant layer disposed between the cathode buffer layer and the cathode and being provided with an electron-injecting dopant which diffuses across the cathode buffer layer to provide an interfacial electron-injecting layer at the interface between the organic light-emitting structure and the cathode buffer layer.

2. The organic light-emitting device of claim 1 wherein the substrate is an electrically insulative and light-transmissive substrate.

3. The organic light-emitting device of claim 2 wherein the anode is a light-transmissive anode having a work function greater than 4 electron volt (eV).

4. The organic light-emitting device of claim 3 wherein light is emitted from the organic light-emitting structure through the anode and the substrate when the anode is at a sufficient positive electrical potential with respect to the cathode.

5. The organic light-emitting device of claim 1 wherein the substrate is an optically opaque substrate.

6. The organic light-emitting device of claim 5 wherein the anode has a work function greater than 4 eV and is electrically conductive.

7. The organic light-emitting device of claim 6 wherein light is emitted from the organic light-emitting structure through the cathode buffer layer and through a light-transmissive cathode when the anode is at a sufficient positive electrical potential with respect to the cathode.

8. The organic light-emitting device of claim 1 wherein the organic light-emitting structure is comprised of:
  (i) an organic hole-transporting layer formed over the anode;
  (ii) an organic light-emitting layer formed over the hole-transporting layer; and
  (iii) an organic electron-transporting layer formed over the light-emitting layer.

9. The organic light-emitting device of claim 8 wherein the organic hole-transporting layer includes hole-transporting aromatic tertiary amine molecules.

10. The organic light-emitting device of claim 8 wherein the organic light-emitting layer includes a light-emitting metal chelated oxinoid compound.

11. The organic light-emitting device of claim 10 wherein the organic light-emitting layer further includes at least one dye capable of emitting light when dispersed in the light-emitting metal chelated oxinoid compound.

12. The organic light-emitting device of claim 8 wherein the electron-transporting layer includes a metal chelated oxinoid compound.

13. The organic light-emitting device of claim 1 wherein a selected porphyrinic compound is a phthalocyanine compound.

14. The organic light-emitting device of claim 13 wherein the phthalocyanine compound is a metal phthalocyanine.

15. The organic light-emitting device of claim 14 wherein a selected metal phthalocyanine is copper phthalocyanine.

16. The organic light-emitting device of claim 1 wherein the cathode buffer layer has a thickness in a range of 5–100 nm.

17. The organic light-emitting device of claim 16 wherein the cathode buffer layer is a light-transmissive layer.

18. The organic light-emitting device of claim 17 wherein the cathode buffer layer protects the organic light-emitting structure from damage during a high energy deposition of a cathode.

19. The organic light-emitting device of claim 1 wherein the dopant layer is provided with an electron-injecting dopant selected to have a work function less than 4.0 eV.

20. The organic light-emitting device of claim 19 wherein the dopant is selected from the Periodic Table groups IA and IIA.

21. The organic light-emitting device of claim 20 wherein the cathode is formed by thermal evaporation or high energy deposition and of a cathode material selected to have a work function greater than 4.0 eV.

22. The organic light-emitting device of claim 21 wherein the cathode material is selected from the group consisting of elemental metals and electrically conductive metal oxides.

* * * * *